United States Patent
Takahashi

(10) Patent No.: US 12,066,480 B2
(45) Date of Patent: Aug. 20, 2024

(54) AIR BLOW GUIDE MEMBER, TEST DEVICE UNIT, TEST DEVICE, ELECTRICAL COMPONENT SOCKET, AND TEST DEVICE INCLUDING A PLURALITY OF THE ELECTRICAL COMPONENT SOCKETS

(71) Applicant: ENPLAS CORPORATION, Kawaguchi (JP)

(72) Inventor: Mineto Takahashi, Kawaguchi (JP)

(73) Assignee: ENPLAS CORPORATION, Saitama (JP)

( * ) Notice: Subject to any disclaimer, the term of this patent is extended or adjusted under 35 U.S.C. 154(b) by 187 days.

(21) Appl. No.: 17/775,184

(22) PCT Filed: Dec. 24, 2020

(86) PCT No.: PCT/JP2020/048508
§ 371 (c)(1),
(2) Date: May 6, 2022

(87) PCT Pub. No.: WO2021/132488
PCT Pub. Date: Jul. 1, 2021

(65) Prior Publication Data
US 2022/0397598 A1 Dec. 15, 2022

(30) Foreign Application Priority Data
Dec. 25, 2019 (JP) .................................. 2019-235170

(51) Int. Cl.
*G01R 31/26* (2020.01)
*H01R 13/533* (2006.01)
(52) U.S. Cl.
CPC ....... *G01R 31/2601* (2013.01); *H01R 13/533* (2013.01)

(58) Field of Classification Search
CPC ............. G01R 31/2601; G01R 1/0458; G01R 31/2877; H01R 13/533
See application file for complete search history.

(56) References Cited

U.S. PATENT DOCUMENTS

| | | | |
|---|---|---|---|
| 7,611,402 B2* | 11/2009 | McClellan | ......... H05K 7/20154 361/679.48 |
| 2004/0077200 A1* | 4/2004 | Ishikawa | ................ G01R 31/01 439/190 |

(Continued)

FOREIGN PATENT DOCUMENTS

| JP | 4-233300 A | 8/1992 |
|---|---|---|
| JP | 7-27818 A | 1/1995 |

(Continued)

OTHER PUBLICATIONS

International Search Report, PCT/ISA/210, dated Mar. 16, 2021, in International Application No. PCT/JP2020/048508.

(Continued)

*Primary Examiner* — Akm Zakaria
(74) *Attorney, Agent, or Firm* — STAAS & HALSEY LLP

(57) ABSTRACT

An air blow guide member 100 for cooling an electrical component accommodated in an electrical component socket 10 is configured to guide flowing air K supplied from a ventilation unit 3 toward the electrical component socket 10. Further, a test device unit 2 including the air blow guide member 100 and the electrical component socket 10 is configured so that the flowing air K supplied from the air ventilation unit 3 is guided toward the electrical component socket 10 by the air blow guide member 100. Further, a test device includes a plurality of the test units 2 arranged from an upstream side toward a downstream side of the flowing air K supplied from the ventilation unit 3.

7 Claims, 19 Drawing Sheets

(56) References Cited

U.S. PATENT DOCUMENTS

| | | |
|---|---|---|
| 2005/0179457 A1 | 8/2005 | Min et al. |
| 2006/0197546 A1 | 9/2006 | Co et al. |
| 2007/0229103 A1* | 10/2007 | Tani .................... G01R 1/0483 |
| | | 324/754.08 |
| 2021/0055343 A1* | 2/2021 | Qu ...................... G01R 1/0458 |

FOREIGN PATENT DOCUMENTS

| | | | |
|---|---|---|---|
| JP | 2005-337835 A | 12/2005 | |
| JP | 2006-337359 A | 12/2006 | |
| JP | 2007-333435 A | 12/2007 | |
| JP | 2007333435 A * | 12/2007 | ............ G01R 31/26 |
| JP | 2008-14655 A | 1/2008 | |
| WO | WO 03/007007 A1 | 1/2003 | |
| WO | WO 2009/118855 A1 | 10/2009 | |

OTHER PUBLICATIONS

Written Opnion, PCT/ISA/237, dated Mar. 16, 2021 in International Application No. PCT/JP2020/048508.

* cited by examiner

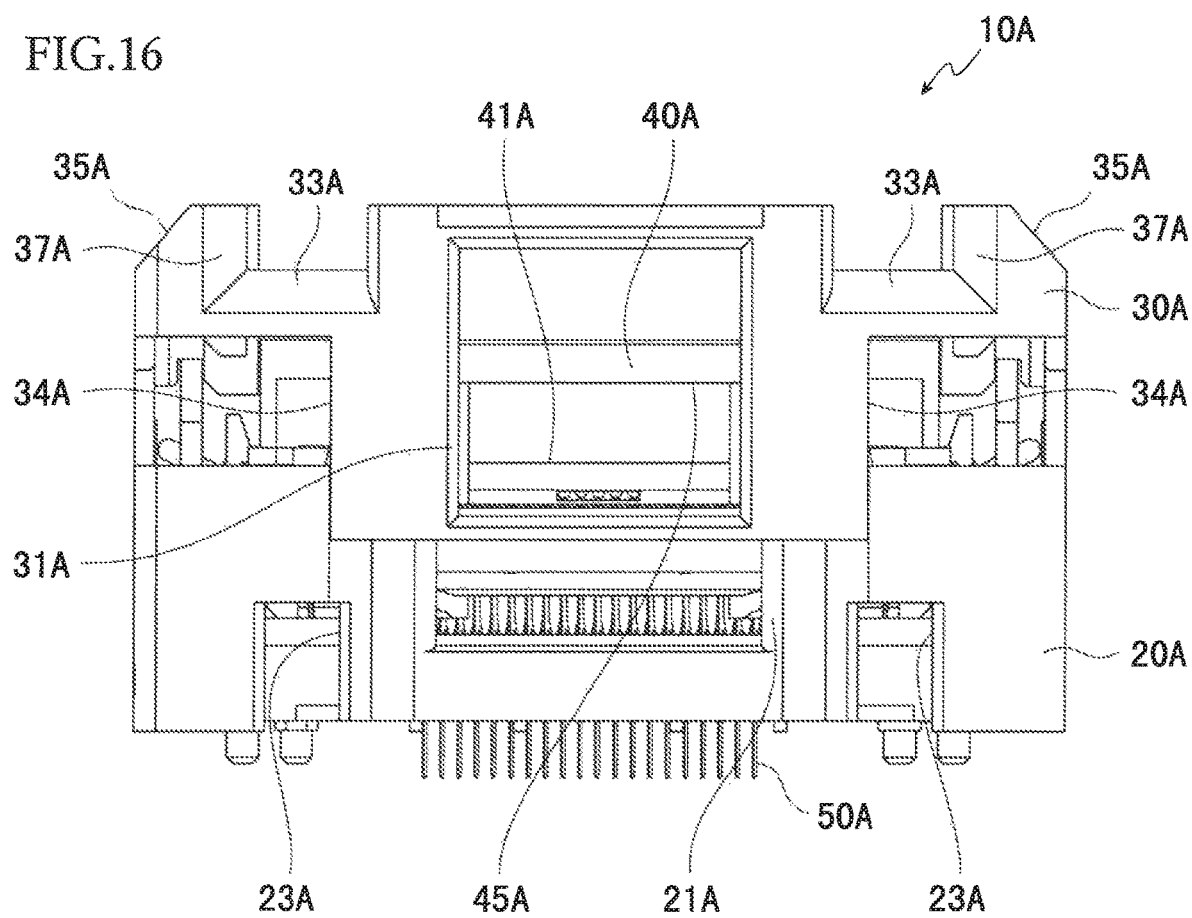

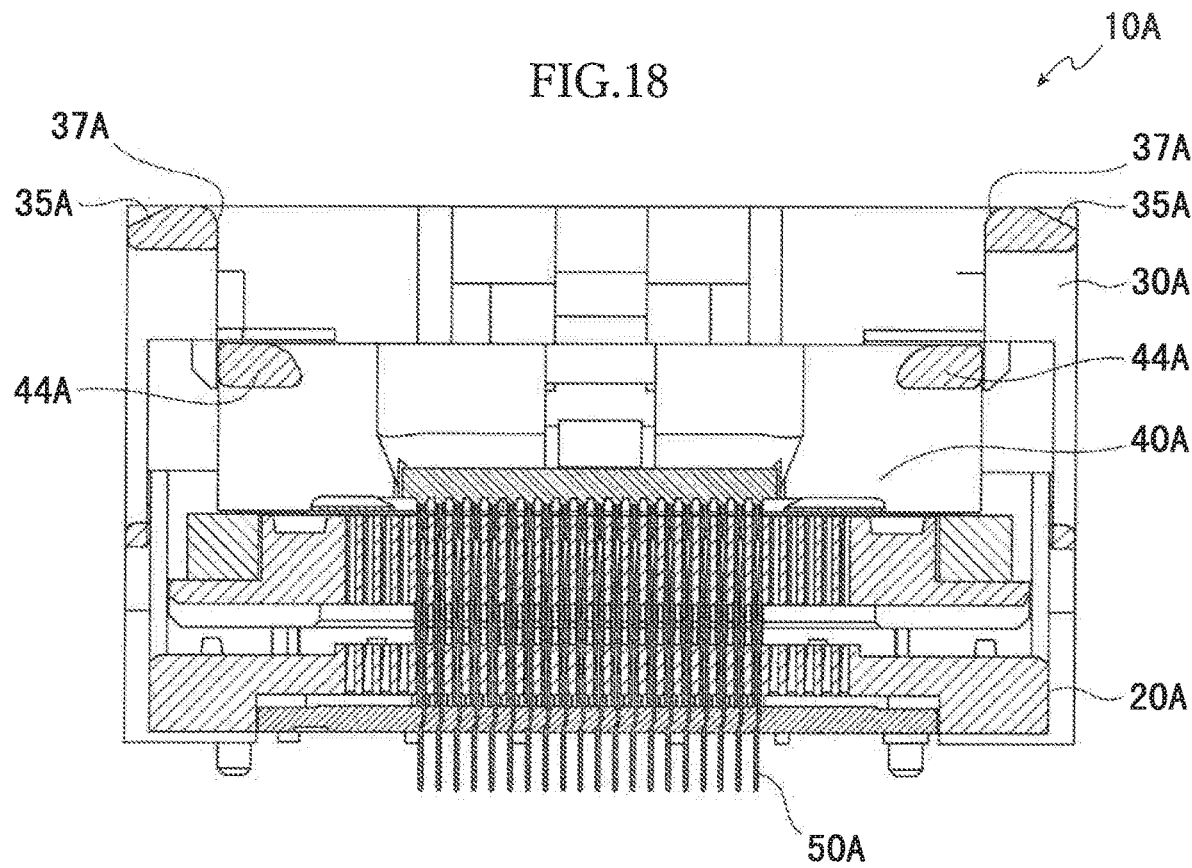

AIR BLOW GUIDE MEMBER, TEST DEVICE UNIT, TEST DEVICE, ELECTRICAL COMPONENT SOCKET, AND TEST DEVICE INCLUDING A PLURALITY OF THE ELECTRICAL COMPONENT SOCKETS

CROSS REFERENCE TO RELATED APPLICATIONS

This application is a U.S. National Stage application filed under 35 USC 371 of international application No. PCT/JP2020/048508, filed on Dec. 24, 2020, and claims foreign priority to Japanese Patent Application No. 2019-235170 filed on Dec. 25, 2019, the disclosures of each of which are incorporated herein by reference in their entirety.

FIELD

The present invention relates to an electrical component socket, an air blow guide member used for cooling an electrical component such as a semiconductor device (hereinafter referred to as an "IC package") accommodated in and electrically connected to the electrical component socket, a test device unit provided with the air blow guide member, and a test device including a plurality of the test device units.

BACKGROUND

Traditionally, in order to suppress the temperature rise of an IC package in a test device and to cool the IC package, it has been known to provide an IC socket as an "electrical component socket" with a heat sink, as disclosed in Patent Document 1, which is rotatably provided and abuts against the IC package at the time of a test to radiate heat, thereby suppressing the temperature rise of the IC package.

LIST OF DOCUMENTS

Patent Documents

Patent Document 1: Japanese Patent Application Publication No. 2008-14655

SUMMARY

Technical Problem

However, in such a traditional heat sink, since the heat sink is manufactured by cutting metal, there has been a problem that the cost is increased. In addition, when the IC package is inserted into and removed from the IC socket, if the heat sink is provided in the IC socket, a member for rotating the heat sink is required, which further increases the cost.

In view of the above, it is an object of the present invention to provide an air blow guide member capable of cooling an electrical component accommodated in an electrical component socket while suppressing the cost, a test device unit provided with the air blow guide member, a test device including a plurality of test device units, an electrical component socket, and a test device including a plurality of the electrical component sockets.

Solution to Problem

To solve such problems, according to an embodiment of the present invention, an air blow guide member for cooling an electrical component accommodated in an electrical component socket is configured to guide flowing air supplied from a ventilation unit toward the electrical component socket.

Further, according to an embodiment of the present invention, a through hole for guiding the flowing air supplied from the ventilation unit toward the electrical component socket in which the electrical component is accommodated is formed at a plate-shaped air blow guide member body.

Further, according to an embodiment of the present invention, the through hole has such a shape that air velocity on an outlet side being on the electrical component socket side is higher than that on an inlet side being on the ventilation unit side.

Further, according to an embodiment of the present invention, the through hole has such a shape to supply swirled flowing air whose air velocity on the outlet side being on the electrical component socket side is higher than that on the inlet side being on the ventilation unit side.

Further, according to an embodiment of the present invention, a test device unit includes the air blow guide member and the electrical component socket, and the flowing air supplied from the ventilation unit is guided toward the electrical component socket by the air blow guide member.

Further, according to an embodiment of the present invention, the electrical component socket includes a plurality of contact pins which come into contact with terminals of the electrical component and a contact-pin opening portion having a part thereof facing the contact pins be opened, and the flowing air guided by the air blow guide member is blown to the plurality of contact pins via the contact-pin opening portion.

Further, according to an embodiment of the present invention, the electrical component socket includes an electrical-component opening portion having a part thereof facing the accommodated electrical component be opened, and the flowing air guided by the air blow guide member is blown to the electrical component via the electrical-component opening portion.

Further, according to an embodiment of the present invention, a test device includes a plurality of the test device units arranged from an upstream side toward a downstream side of the flowing air supplied from the ventilation unit.

Further, according to an embodiment of the present invention, an electrical component socket includes a socket body arranged on a wiring board and including an accommodation portion in which an electrical component is accommodated; and a contact pin arranged in the socket body and coming into contact with a terminal arranged on the wiring board and a terminal arranged at the electrical component. Here, an opening portion through which flowing air is supplied toward the electrical contact pin is formed at a sidewall portion of the socket body.

Further, according to an embodiment of the present invention, the opening portions are formed at substantially the same positions of two mutually-facing sidewall portions of the socket body so that the flowing air is discharged to an opposite side after passing through inside of the socket body.

Further, according to an embodiment of the present invention, the socket body has a corner portion which is R-shaped along flow of the flowing air.

Further, according to an embodiment of the present invention, a test device includes a plurality of the electrical component sockets arranged from an upstream side toward a downstream side of the flowing air supplied from a ventilation unit.

Effect of the Invention

According to the present invention, it is possible, while suppressing the cost, to cool an electrical component accommodated in the electrical component socket.

BRIEF DESCRIPTION OF DRAWINGS

FIG. 16 is a front view of the IC socket according to the second embodiment.

FIGS. 17A and 17B are enlarged views of a contact pin of the IC socket according to the second embodiment, while FIG. 17A shows a state in which an IC package is held and FIG. 17B shows a state in which the IC package is released.

FIG. 18 is an explanatory view of the IC socket according to the second embodiment with some components thereof removed.

DETAILED DESCRIPTION

Hereinafter, embodiments of the present invention will be described.

First Embodiment

FIGS. 1 to 6 show a first embodiment of the present invention.

Figure 1:
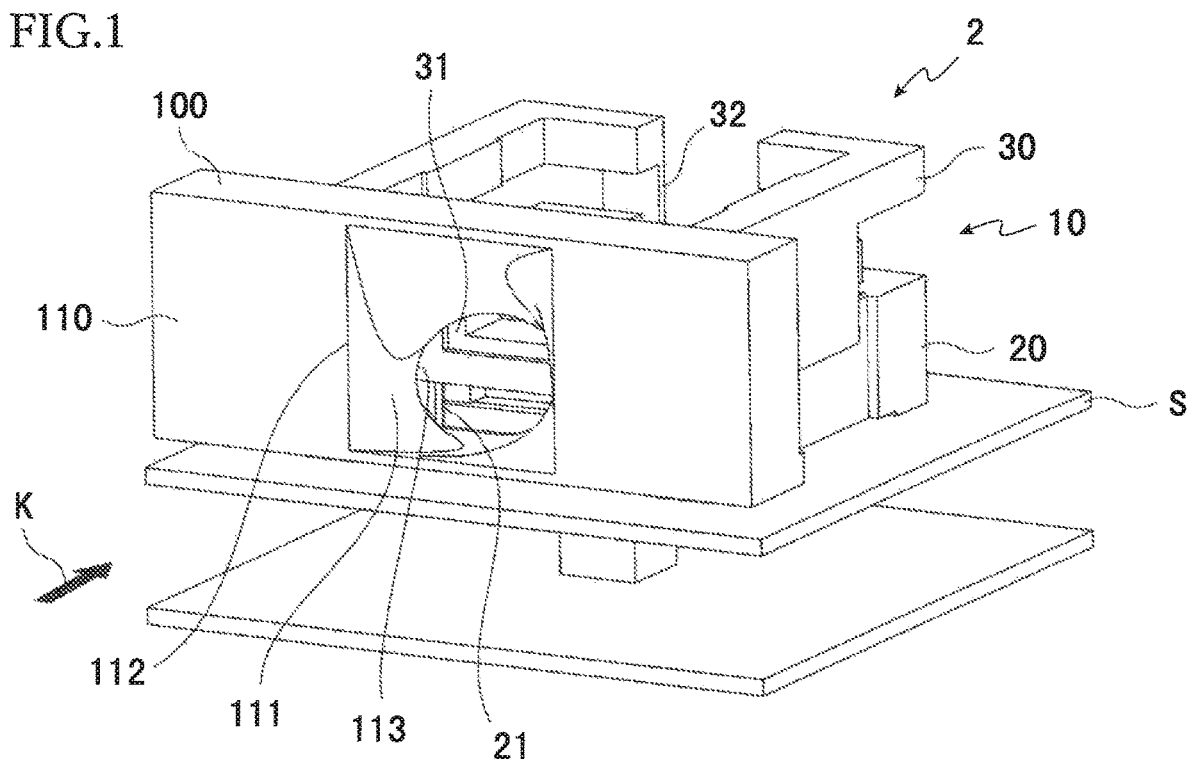
FIG. 1 is a perspective view showing a test device unit according to a first embodiment of the present invention.
Figure 2:
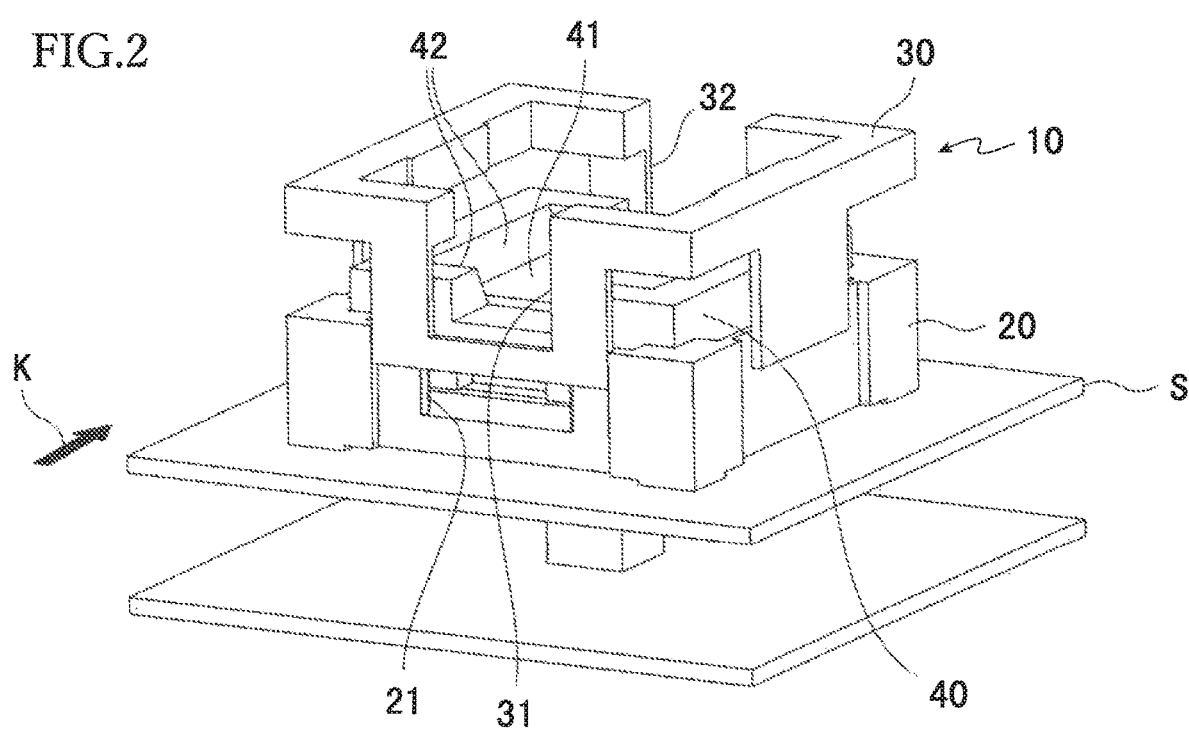
FIG. 2 is a perspective view of an IC socket according to the first embodiment.
Figure 3:
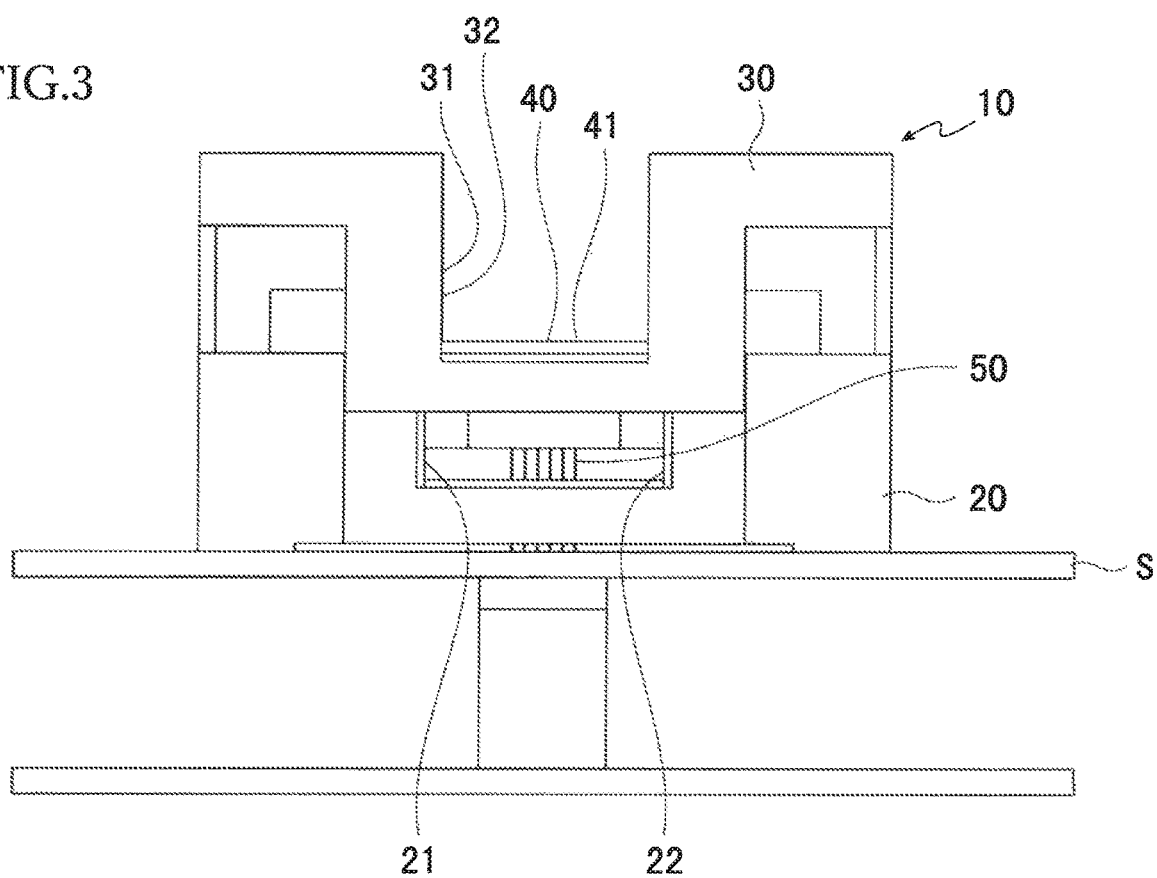
FIG. 3 is a front view of the IC socket according to the first embodiment.

Referring first to the configuration, an IC socket 10 shown in FIGS. 1 to 3 as an "electrical component socket" is used for product inspection such as an electrical continuity test by holding an IC package P (see FIG. 6) as an "electrical component".

Further, as shown in FIG. 1, an air blow guide member 100 for guiding flowing air K supplied from a ventilation unit 3 (see FIG. 6) arranged in a test device 1 (see FIG. 6) toward the IC socket 10 (see FIGS. 4 and 5) is arranged adjacent to the IC socket 10.

Then, the IC socket 10 and the air blow guide member 100 being as a set configures a test device unit 2 of the present invention as shown in FIG. 1.

Figure 6:
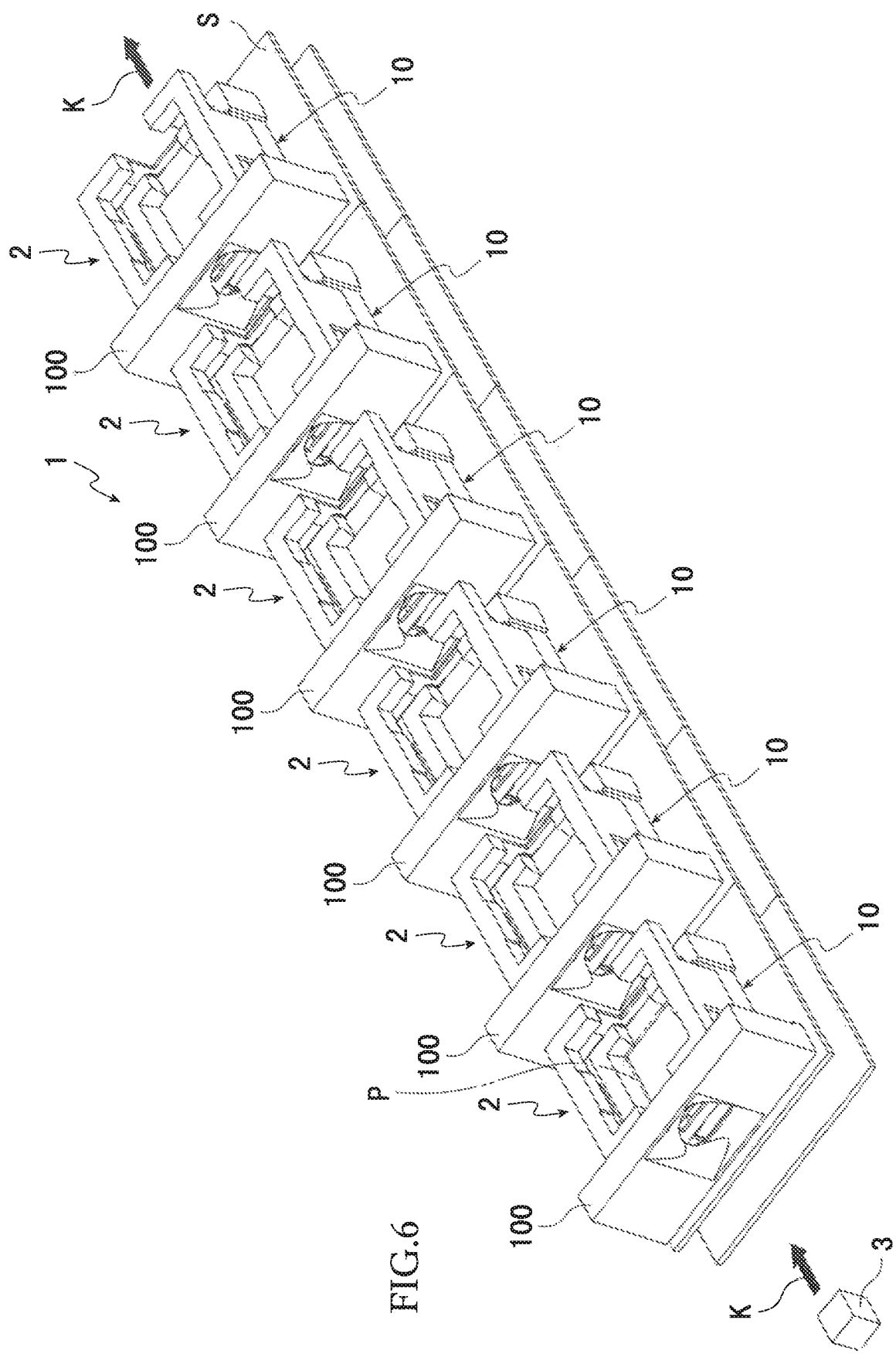
FIG. 6 is a perspective view of a test device according to the first embodiment.

Further, in the present embodiment, the test device 1 for performing product inspection includes the ventilation unit 3 described above and a wiring board S, and as shown in FIG. 6, a plurality of the test device units 2 are arranged on the wiring board S from an upstream side toward a downstream side of the flowing air K supplied from the ventilation unit 3. Although FIG. 6 shows only a state in which the test device units 2 are arranged in a line from the upstream side to the downstream side, a plurality of such lines are arranged to configure the test device 1.

Although not shown in detail, the IC package P of the present embodiment includes a plurality of terminals (solder balls) formed at a predetermined pitch on a bottom surface of a rectangular package body.

Hereinafter, each component of the test device 1 will be described in detail.

As shown in FIGS. 1 to 3, the IC socket 10 of the present embodiment includes a socket body 20 arranged on the wiring board S, an accommodation member 40 including an accommodation portion 41 for accommodating the IC package P, contact pins 50 for electrically connecting terminals of the IC package P and the wiring board S, and an operation member 30 for operating the contact pins 50.

As shown in FIGS. 1 to 3, the socket body 20 is fixed to a predetermined position of the wiring board S, and the contact pins 50 are fixed to the socket body 20. Further, a contact-pin opening portion 21 formed of a through hole is formed at the socket body 20 on the upstream side of the flowing air K, flowing in the test device 1, beside the position where the contact pins 50 are arranged. Thus, the flowing air K flowing through the air blow guide member 100 is guided to the contact pins 50.

Further, a contact-pin discharge opening portion 22 formed of a through hole similar to the contact-pin opening portion 21 is formed at the socket body 20 on the downstream side of the flowing air K beside the position where the contact pins 50 are arranged. Thus, as shown in FIG. 6, the flowing air K having passed through the socket body 20 is guided to the next test device unit 2 arranged on the downstream side.

Further, the accommodation member 40 includes the accommodation portion 41 for the IC package P at the substantial center thereof, and an opening portion (not shown) is formed at the substantial center of the accommodation portion 41. Further, a guide portion 42 formed in an inclined shape is arranged on a peripheral edge of the accommodation portion 41 of the accommodation member 40 so as to guide the IC package P toward the center of the accommodation portion 41 when the IC package P is accommodated in the accommodation portion 41.

Further, the contact pins 50 each formed in an elongated shape are held in the socket body 20 in a matrix form below the accommodation portion 41 and arranged at positions corresponding to the positions of the terminals of the IC package P positioned at the opening portion of the accommodation portion 41. Further, an upper end portion (not shown) of each of the contact pins 50 is configured to be opened and closed by the operation of the operation member 30, and is configured to be electrically connected to the IC package P by pinching and holding a corresponding terminal of the IC package P when the upper end portion is closed after being opened.

The operation member 30 is a frame-shaped member, is urged upward with respect to the socket body 20 by an urging unit such as a spring, and is arranged so as to be vertically movable with respect to the socket body 20. When the operation member 30 is pressed down, the upper end portion of each of the contact pins 50 is opened. When the downward pressing force of the operation member 30 is released, the operation member 30 is moved upward by the urging force of the urging unit and the upper end portion of each of the contact pins 50 is closed accordingly, thereby the terminals of the IC package P are pinched and held at this time so that the IC package P and the wiring board S are electrically connected via the contact pins 50.

An IC-package opening portion 31 as an "electrical-component opening portion" having a cut-out shape is formed at the operation member 30 on the upstream side of the flowing air K, flowing in the test device 1, beside the accommodation portion 41 in which the IC package P is accommodated. Thus, the flowing air K flowing through the air blow guide member 100 is guided to the IC package P accommodated in the accommodation portion 41.

Further, an IC-package discharge opening portion 32 having a cut-out shape similar to the IC-package opening portion 31 is formed at the operation member 30 on the downstream side of the flowing air K, flowing in the test device 1, beside the accommodation portion 41 in which the IC package P is accommodated. Thus, as shown in FIG. 6, the flowing air K having passed through the IC package P in the accommodation portion 41 is guided to the next test device unit 2 arranged on the downstream side.

Figure 4:
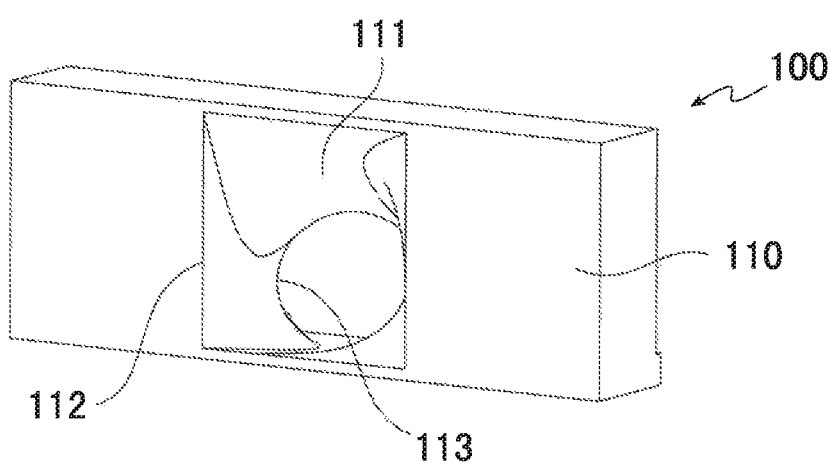
FIG. 4 is a perspective view, viewing from a front side, of an air blow guide member according to the first embodiment.
Figure 5:
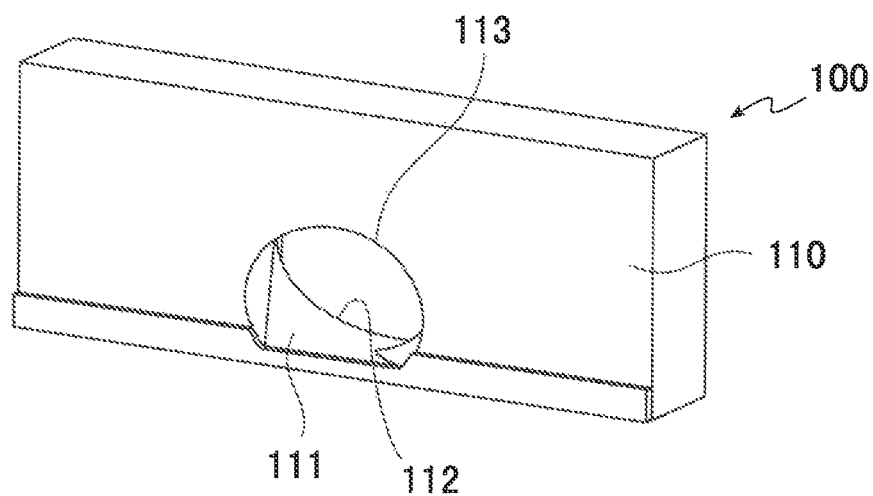
FIG. 5 is a perspective view, viewing from a rear side, of the air blow guide member according to the first embodiment.

Next, the air blow guide member 100 will be described. As shown in FIGS. 1 and 6, the air blow guide member 100 of the present embodiment is arranged on the wiring board S on the upstream side of the flowing air K supplied from the ventilation unit 3 in the test device 1 for the IC socket 10, and includes a plate-shaped air blow guide member body 110. Further, as shown in FIGS. 4 and 5, a through hole 111 is formed in the substantial center of the air blow guide member body 110, and the flowing air K supplied from the ventilation unit 3 passes through the through hole 111 and is guided toward the IC socket 10. Here, the through hole 111 is arranged so as to face the contact-pin opening portion 21 and the IC-package opening portion 31. The flowing air K flowing through the air blow guide member 100 is guided to the contact pins 50 via the contact-pin opening portion 21 and guided to the IC package P accommodated in the accommodation portion 41 via the IC-package opening portion 31.

As shown in FIGS. 4 and 5, the through hole 111 is formed such that an inlet 112 on the side of the ventilation unit 3 (i.e., on the upstream side) is wide and an outlet 113 on the side of the IC socket 10 (i.e., the downstream side) is narrow. Further, the through hole 111 is formed in a spiral shape. Thus, the flowing air K supplied from the ventilation unit 3 is adapted to be narrowed while being swirled, so that the air velocity of the flowing air K guided toward the IC socket 10 is increased even when air velocity of the ventilation unit 3 is not changed.

Next, the operation of the present embodiment will be described with reference to FIGS. 1 to 6.

Here, description will be provided on a case in which the IC package P is accommodated in the IC socket 10 and a test is performed.

The IC socket 10 and the air blow guide member 100 are attached to the wiring board S in advance. Then, the IC package P is electrically connected to the IC socket 10 by being set thereto by, for example, an automatic machine as follows.

That is, the IC package P is conveyed by the automatic machine and is held at a position above the accommodation portion 41 of the accommodation member 40 of the IC socket 10. Then, the IC package P is accommodated in the accommodation portion 41. At this time, the IC package P is accommodated in the accommodation portion 41 while being guided by the guide portion 42. At the same time, the operation member 30 is pressed from above by the automatic machine, and the operation member 30 is pushed downward against the urging force of the urging unit. As a result, the upper end portions of the contact pins 50 are opened and ready to receive the IC package P. Thereafter, the pressing force to the operation member 30 is released to move the operation member 30 upward, the upper end portions of the contact pins 50 pinch and hold the terminals of the IC package P, and electrical connection is established among the IC package P, the contact pins 50, and the wiring board S.

Thereafter, a burn-in test is performed in the test device 1. During the test, the flowing air K is guided toward the IC socket 10 via the air blow guide member 100, and cools the IC package P accommodated in the IC socket 10 to suppress the temperature rise. At that time, the contact-pin opening portion 21 formed of a through hole is formed at the socket body 20 on the upstream side of the flowing air K (i.e., on the side of the ventilation unit 3), flowing in the test device 1, beside the position where the contact pins 50 are arranged. Further, the IC-package opening portion 31 having a cut-out shape is formed at the operation member 30 on the upstream side of the flowing air K (i.e., on the side of the ventilation unit 3), flowing in the test device 1, beside the accommodation portion 41 in which the IC package P is accommodated.

Further, the through hole 111 of the air blow guide member 100 is arranged so as to face the contact-pin opening portion 21 and the IC-package opening portion 31. Thus, the flowing air K flowing through the air blow guide member 100 is guided to the contact pins 50 via the contact-pin opening portion 21 to cool the contact pins 50 in contact with the IC package P, thereby indirectly cooling the IC package P, and the flowing air K flowing through the air blow guide member 100 is guided to the IC package P accommodated in the accommodation portion 41 via the IC-package opening portion 31 to directly cool the IC package P. In this way, by effectively taking the flowing air K supplied from the ventilation unit 3 into the IC socket 10 and supplying the flowing air K to the contact pins 50 and the exposed portion of the IC package P, the IC package P can be efficiently cooled.

As shown in FIG. 6, a plurality of the test device units 2 are arranged in the test device 1 from the upstream side toward the downstream side such that each air blow guide member 100 is arranged on the upstream side of the corresponding IC socket 10. Then, the contact-pin discharge opening portion 22 formed of a through hole similar to the contact-pin opening portion 21 is formed at the socket body 20 on the downstream side of the flowing air K beside the position where the contact pins 50 are arranged. Further, the IC-package discharge opening portion 32 having a cut-out shape similar to the IC-package opening portion 31 is formed at the operation member 30 on the downstream side of the flowing air K, flowing in the test device 1, beside the accommodation portion 41 in which the IC package P is accommodated. Thus, the flowing air K having passed through the socket body 20 and the IC package P in the accommodation portion 41 is guided to the next test device unit 2 arranged on the downstream side, and the flowing air K passes continuously from the upstream side toward the downstream side to cool the IC package P on each IC socket 10.

As described above, according to the air blow guide member 100 of the present embodiment, the IC package P accommodated in the IC socket 10 can be cooled by guiding the flowing air K provided from the ventilation unit 3 toward the IC socket 10. Further, cooling using the air blow guide member 100 does not use a member such as a heat sink, but uses only one plate-shaped member in which the through hole 111 is formed as the air blow guide member body 110, and a mechanism for operating other members is not necessary. Therefore, the cost can be suppressed with a simple structure of one member, and the IC package P can be cooled by reliably guiding the flowing air K.

Further, according to the air blow guide member 100 of the present embodiment, the through hole 111 of the air blow guide member 100 has such a shape that the air velocity on the outlet 113 side being on the IC socket 10 side is higher than that on the inlet 112 side being on the ventilation unit 3 side. Therefore, the IC package P can be effectively cooled by increasing the air velocity on the IC socket 10 side without increasing the air velocity of the ventilation unit 3.

Further, according to the air blow guide member 100 of the present embodiment, the through hole 111 of the air blow guide member 100 has such a shape to supply the swirled flowing air K whose air velocity on the outlet 113 side being on the IC socket 10 side is higher than that on the inlet 112 side being on the ventilation unit 3 side. Therefore, the IC package P can be effectively cooled by increasing the air velocity on the IC socket 10 side without increasing the air velocity of the ventilation unit 3. Further, according to the test device unit 2 of the present embodiment, the IC package P accommodated in the IC socket 10 can be cooled by being provided with the air blow guide member 100 and the IC socket 10 and guiding the flowing air K supplied from the ventilation unit 3 toward the IC socket 10 with the air blow guide member 100.

Further, according to the test device unit 2 of the present embodiment, the contact-pin opening portion 21 having a part thereof facing the plurality of contact pins 50 in the IC socket 10 be opened is arranged, and the flowing air K guided by the air blow guide member 100 is blown to the plurality of contact pins 50 via the contact-pin opening portion 21. Therefore, the IC package P can be indirectly cooled by cooling the contact pins 50 in contact with the IC package P.

Further, according to the test device unit 2 of the present embodiment, the IC-package opening portion 31 having a part facing the IC package P accommodated in the IC socket 10 be opened is provided, and the flowing air K guided by the air blow guide member 100 is blown to the IC package P via the IC-package opening portion 31. Therefore, the IC package P can be reliably cooled by being blown directly with the flowing air K.

Further, according to the test device 1 of the present embodiment, the plurality of test device units 2 are arranged on a line from the upstream side toward the downstream side of the flowing air K supplied from the ventilation unit 3, and the air blow guide member 100, the contact-pin opening portion 21, the contact-pin discharge opening portion 22, the IC-package opening portion 31, the IC-package discharge opening portion 32, and the like are effectively arranged. Thus, one ventilation unit 3 causes the flowing air K to pass through in succession from the upstream side to the downstream side, so that the plurality of IC packages P accommodated in the plurality of IC sockets 10 can be cooled simultaneously and efficiently.

In the present embodiment, the air blow guide member 100 having the through hole 111 as shown in FIGS. 4 and 5 is used, but not limited thereto, an air blow guide member with a through hole having another shape may be used.

Figure 7:
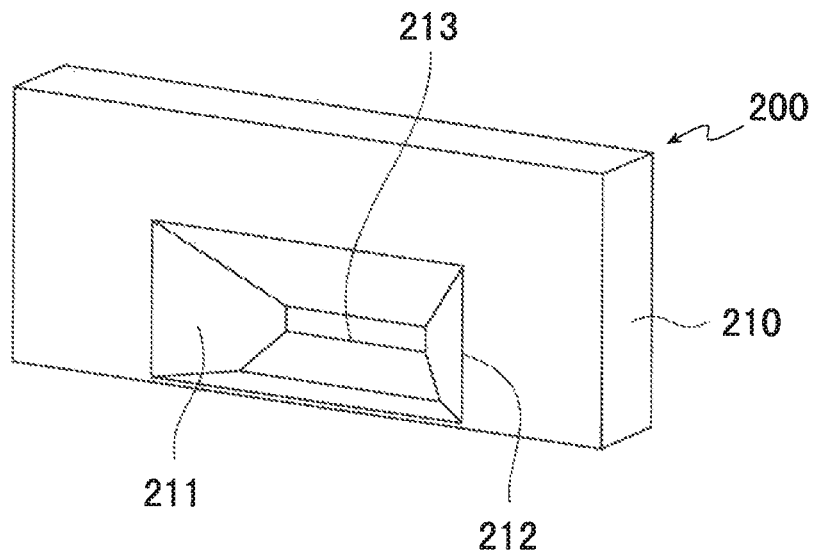
FIG. 7 is a perspective view, viewing from the front side, of an air blow guide member of a first modification according to of the first embodiment.
Figure 8:
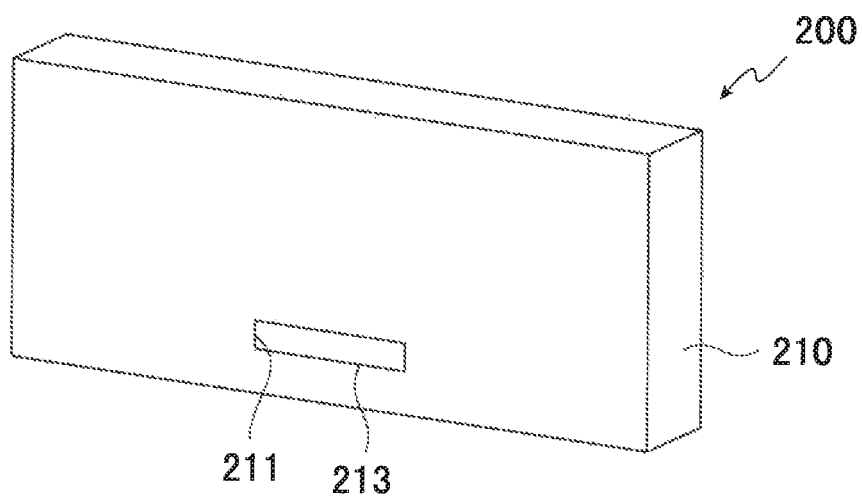
FIG. 8 is a perspective view, viewing from the rear side, of the air blow guide member of the first modification according to the first embodiment.

For example, as in an air blow guide member 200 shown in a first modification shown in FIGS. 7 and 8, a through hole 211 formed in an air blow guide member body 210 may have a rectangular shape, and opening area thereof may decrease from an inlet 212 side toward an outlet 213 side.

Figure 9:
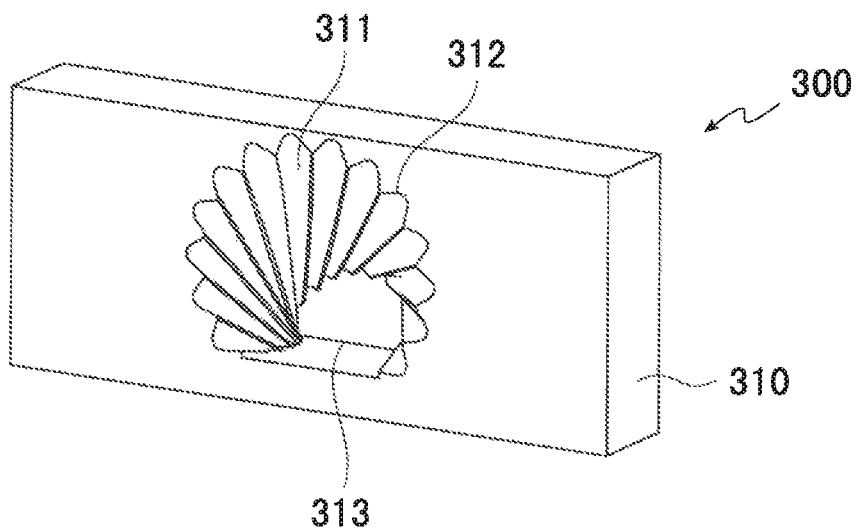
FIG. 9 is a perspective view, viewing from the front side, of an air blow guide member of a second modification according to the first embodiment.
Figure 10:
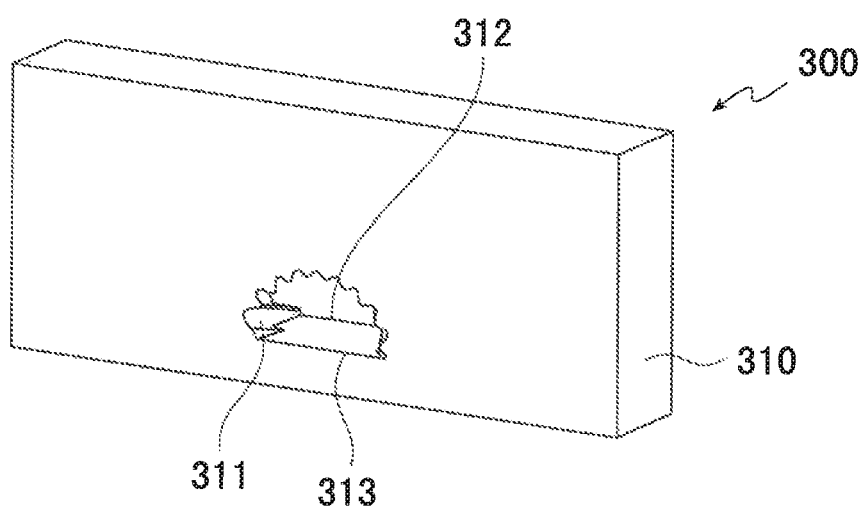
FIG. 10 is a perspective view, viewing from the rear side, of the air blow guide member of the second modification according to the first embodiment.

Further, as in an air blow guide member 300 shown in a second modification shown in FIGS. 9 and 10, a through hole 311 formed in an air blow guide member body 310 may have a plurally-stepped petal shape, and opening area thereof may decrease from an inlet 312 side toward an outlet 313 side.

Figure 11:
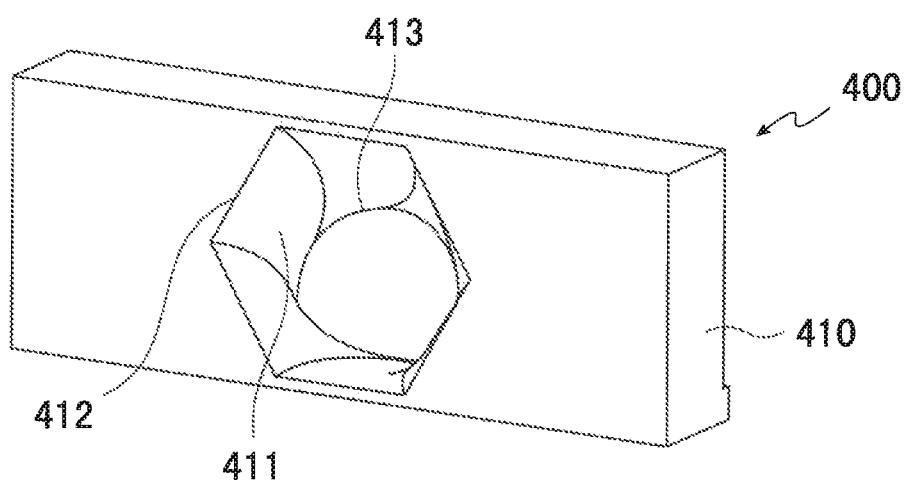
FIG. 11 is a perspective view, viewing from the front side, of an air blow guide member of a third modification according to the first embodiment.
Figure 12:
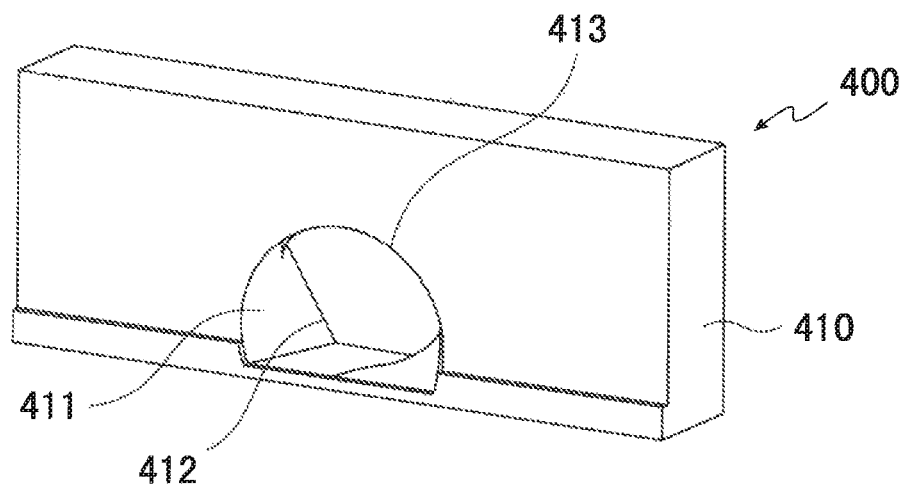
FIG. 12 is a perspective view, viewing from the rear side, of the air blow guide member of the third modification according to the first embodiment.

Further, as in an air blow guide member 400 shown in a third modification shown in FIGS. 11 and 12, a through hole 411 formed in an air blow guide member body 410 may have a polygonal shape (here, a hexagonal shape), and opening area thereof may decrease from an inlet 412 side toward an outlet 413 side.

Figure 13:
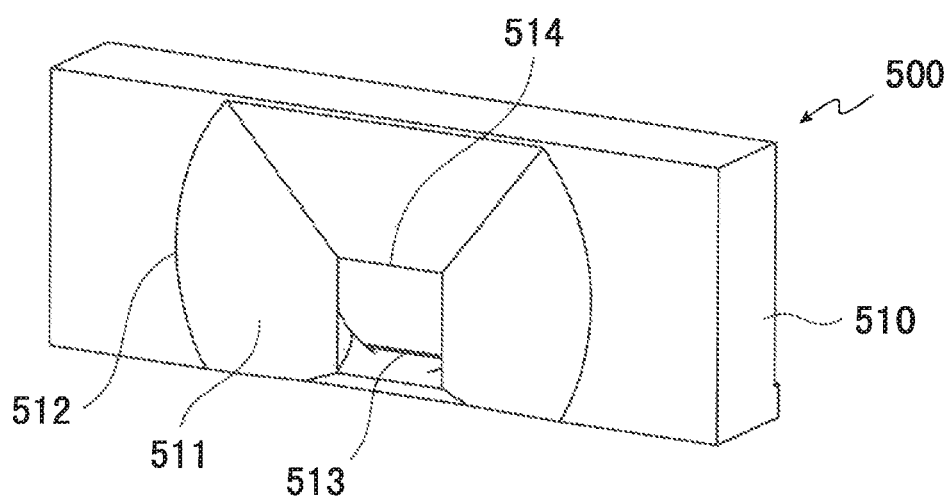
FIG. 13 is a perspective view, viewing from the front side, of an air blow guide member of a fourth modification according to the first embodiment.
Figure 14:
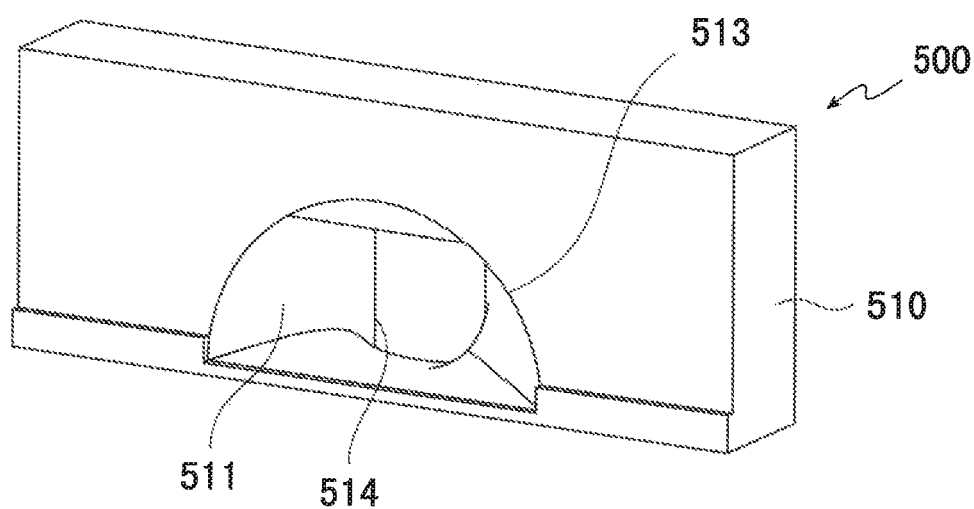
FIG. 14 is a perspective view, viewing from the rear side, of the air blow guide member of the fourth modification according to the first embodiment.
Figure 15:
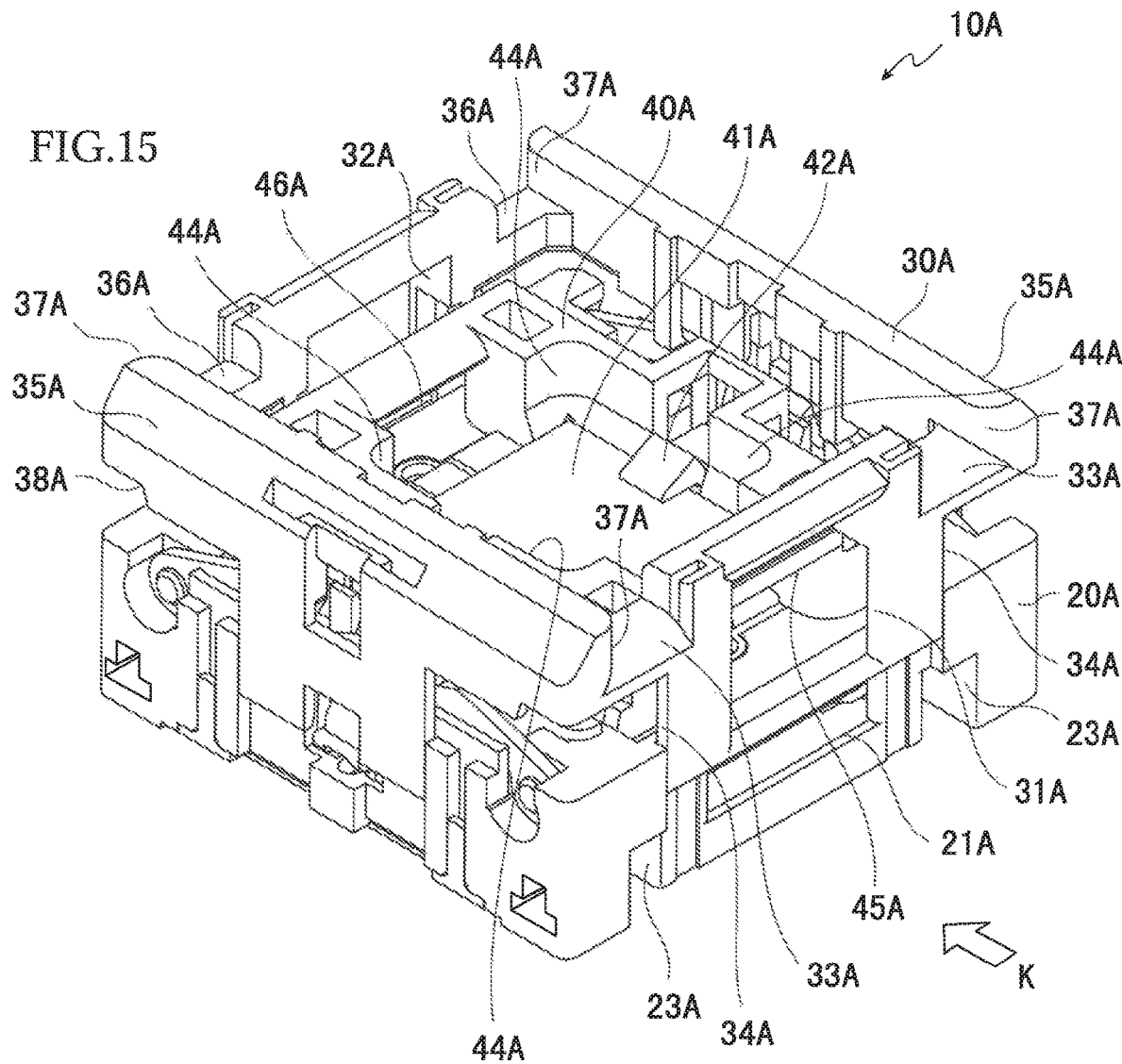
FIG. 15 is a perspective view of an IC socket according to a second embodiment.

Further, as in an air blow guide member 500 shown in a fourth modification shown in FIGS. 13 and 14, a through hole 511 formed in an air blow guide member body 510 may be configured to be widest on an inlet 512 side, to have minimum area at an intermediate position 514, and then to be slightly widened on an outlet 513 side.

<Effects>

According to the present invention, it is possible, while suppressing the cost, to cool an electrical component accommodated in the electrical component socket.

That is, according to the air blow guide member of the present invention, the electrical component accommodated in the electrical component socket can be cooled by guiding the flowing air supplied from the ventilation unit toward the electrical component socket. Further, it is possible to suppress the cost with a simple structure without using a member such as a heat sink.

Further, the through hole for guiding the flowing air supplied from the ventilation unit toward the electrical component socket in which the electrical component is accommodated is formed at the plate-shaped air blow guide member body. Therefore, the electrical component can be cooled by reliably guiding the flowing air while suppressing the cost with one member.

Further, the through hole of the air blow guide member has such a shape that the air velocity on the outlet side being on the electrical component socket side is higher than that on the inlet side being on the ventilation unit side. Therefore, the electrical component can be effectively cooled by increasing the air velocity on the electrical component socket side without increasing the air velocity of the ventilation unit.

Further, the through hole of the air blow guide member has such a shape to supply the swirled flowing air whose air velocity on the outlet side being on the electrical component socket side is higher than that on the inlet side being on the ventilation unit side. Therefore, the electrical component can be effectively cooled by increasing the air velocity on the electrical component socket side without increasing the air velocity of the ventilation unit.

Further, according to the test device unit of the present invention, the electrical component accommodated in the electrical component socket can be cooled by being provided with the air blow guide member and the electrical component socket and guiding the flowing air supplied from the ventilation unit toward the electrical component socket.

Further, the contact-pin opening portion having a part thereof facing the plurality of contact pins in the electrical component socket be opened is arranged, and the flowing air guided by the air blow guide member is blown to the plurality of contact pins via the contact-pin opening portion. Therefore, the electrical component can be indirectly cooled by cooling the contact pins in contact with the electrical component.

Further, the electrical-component opening portion having a part thereof facing the electrical component accommodated in the electrical component socket be opened is arranged, and the flowing air guided by the air blow guide member is blown to the electrical component via the electrical-component opening portion. Therefore, the electrical component can be reliably cooled by being blown directly with the flowing air.

Further, in the test device of the present invention, a plurality of the test device units are arranged from the upstream side toward the downstream side of the flowing air supplied from the ventilation unit. Thus, one ventilation unit causes the flowing air to pass through in succession from the upstream side to the downstream side, so that the plurality of electrical components accommodated in the plurality of electrical component sockets can be cooled simultaneously and efficiently.

Second Embodiment

Next, a second embodiment of the present invention will be described. FIGS. 15 to 19 show the second embodiment of the present invention. In the present embodiment, description of the same parts as those in the first embodiment will be omitted.

Referring first to the configuration, an IC socket 10A shown in FIGS. 15 to 19 as an "electrical component socket" similar to that in the first embodiment described above is used for product inspection such as an electrical continuity test by holding the IC package P (see FIG. 6) as an "electrical component".

Further, in the present embodiment, the test device for performing product inspection includes the ventilation unit 3 described above and a wiring board S similar to those in the first embodiment, and a plurality of the IC sockets 10A are arranged on the wiring board S from the upstream side toward the downstream side of the flowing air K supplied from the ventilation unit 3 (i.e., being a configuration in which the air blow guide member 100 is removed and the IC socket 10 is replaced with the IC socket 10A). Similarly to the first embodiment described above, the test device of the present embodiment is not limited to the state in which the IC sockets 10A are arranged in a single row from the upstream side toward the downstream side, and a plurality of such rows are provided to configure the test device.

In the following, description will be provided in detail on the IC socket 10A arranged in the test device of the present embodiment.

As shown in FIGS. 15 to 19, the IC socket 10A of the present embodiment includes a socket body 20A arranged on the wiring board S, an accommodation member 40A including an accommodation portion 41A for accommodating the IC package P, contact pins 50A for electrically connecting terminals of the IC package P and the wiring board S, and an operation member 30A for operating the contact pins 50A.

Similarly to the first embodiment described above, the socket body 20A is fixed to a predetermined position of the wiring board S, and the contact pins 50A are fixed to the socket body 20. Further, a contact-pin opening portion 21A formed of a through hole as an "opening portion" is formed at the socket body 20A on the upstream side of the flowing air K, flowing in the test device, beside the position where the contact pins 50A are arranged. Thus, the flowing air K supplied from the ventilation unit 3 is guided to the contact pins 50A. The contact-pin opening portion 21A is not blocked by a side wall of the operation member 30A when the operation member 30A moves upward to hold the IC package P, but is opened entirely. Further, opening portions 23A are each formed as well at positions on both sides of the contact-pin opening portion 21A for introducing air therethrough as well to further enhance the cooling effect.

Further, a contact-pin discharge opening portion 22A formed of a through hole as an "opening portion" similar to the contact-pin opening portion 21A is formed at the socket body 20A on the downstream side of the flowing air K beside the position where the contact pins 50A are arranged. Thus, similarly to the first embodiment described above, the flowing air K having passed through the socket body 20A is guided to the next IC socket 10A arranged on the downstream side. Further, opening portions (not shown) are each formed as well at positions on both sides of the contact-pin discharge opening portion 22A, being substantially the same positions as the opening portions 23A, for introducing air therethrough as well to further enhance the cooling effect.

Further, the accommodation member 40A includes an accommodation portion 41A for the IC package P at the substantial center thereof, and an opening portion (not shown) is formed at the substantial center of the accommodation portion 41A. The accommodation member 40A is moved up and down by the operation of the operation member 30A, which will be described later. Specifically, as shown in FIG. 17, when the operation member 30A is pushed downward, the operation member 30A moves downward to open the IC package P, and when the downward pushing to the operation member 30A is released, the operation member 30A moves upward to hold the IC package P. A predetermined amount of clearance G is formed between the accommodation member 40A and the socket body 20A even when the accommodation member 40A is moved downward, so that the contact pins 50A are always exposed to the flowing air supplied from the ventilation unit 3. Further, a guide portion 42A formed in an inclined shape is arranged on a peripheral edge of the accommodation portion 41A of the accommodation member 40A so as to guide the IC package P toward the center of the accommodation portion 41A when the IC package P is accommodated in the accommodation portion 41A.

An opening portion 45A is formed on the upstream side of the sidewall portion of the accommodation portion 41A. The cooling effect is further enhanced by orienting the flowing air toward the IC package P therethrough. Further, an opening portion 46A is formed at a position facing the opening portion 45A on the downstream side of the sidewall portion of the accommodation portion 41A. The cooling effect is further enhanced by discharging the flowing air therethrough.

Figure 19:
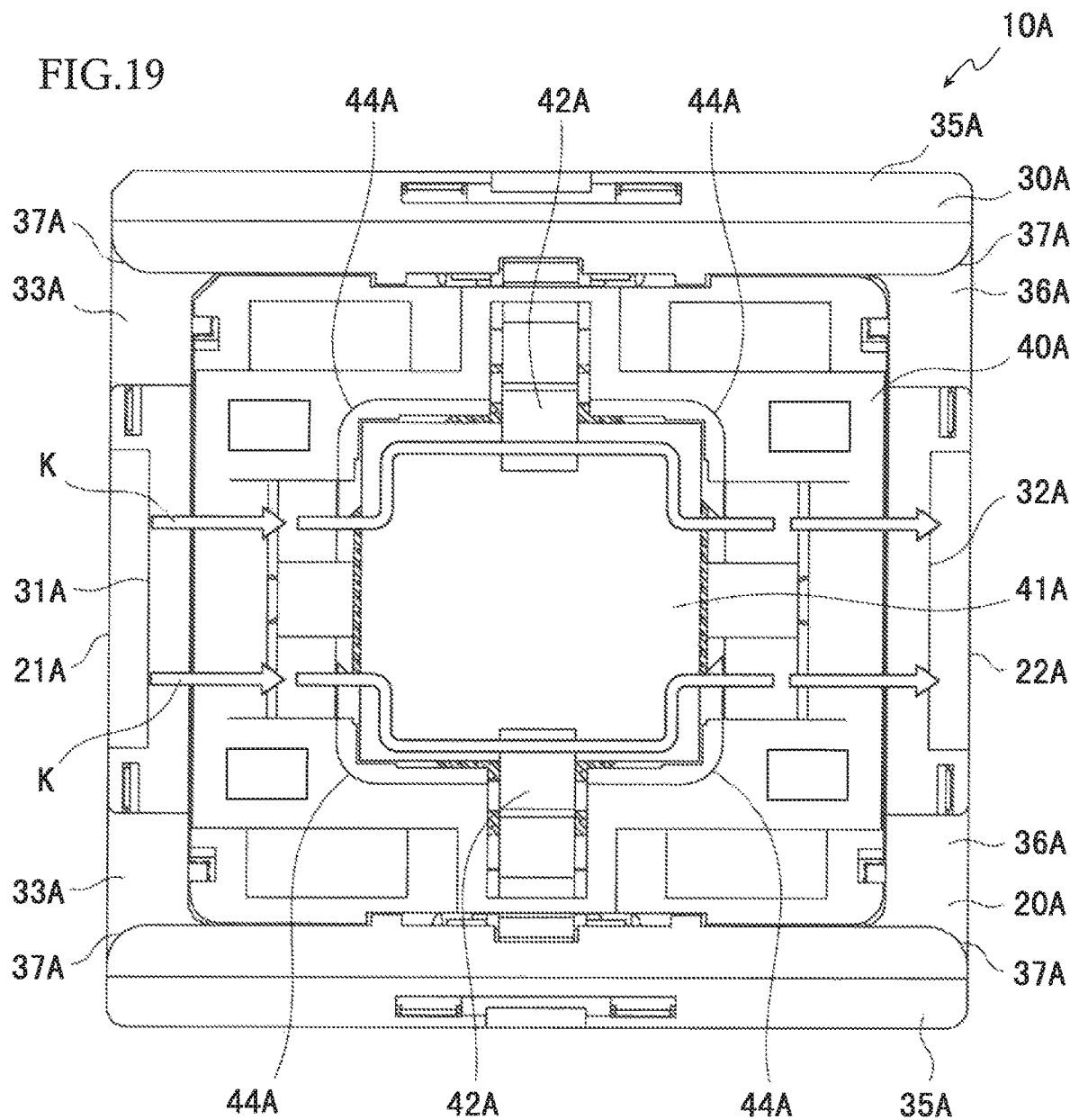
FIG. 19 is an explanatory view of how air flows through the IC socket according to the second embodiment.

Further, an R-shaped portion 44A having an R-shaped corner portion is formed on the inner wall of the accommodation portion 41A, so that the flowing air flows smoothly along the wall as shown in FIG. 19. Therefore, the cooling effect is further enhanced without trapping of air inside.

Figures 17A, 17B:
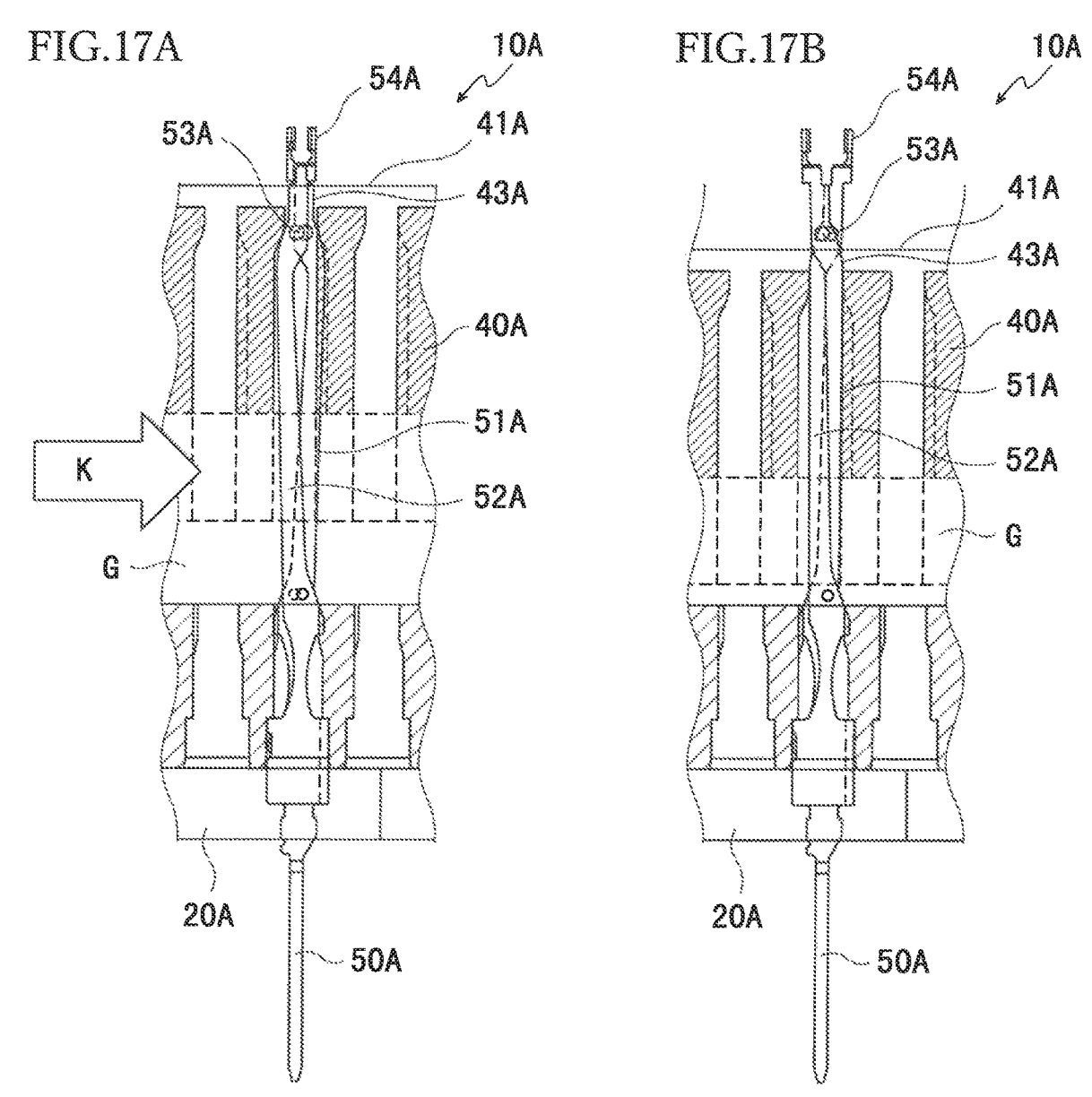

Further, the contact pins 50A each formed in an elongated shape are held in the socket body 20A in a matrix form below the accommodation portion 41A and arranged at positions corresponding to the positions of the terminals of the IC package P positioned at the opening portion of the accommodation portion 41A. Further, each contact pin 50A includes two elongated members 51A, 52A, which are rotated about a fulcrum 53A to cause an upper end portion 54A to be opened and closed. Specifically, when the accommodation member 40A is moved upward from the open state of FIG. 17B by the operation of the operation member 30A described later, the fulcrum 53A is pressed by a narrow portion 43A of the accommodation member 40A as shown in FIG. 17A, so that the upper end portion 54A is closed to be in the holding state. Further, electrical connection with the IC package P is established when the upper end portion 54A is closed after being opened to pinch and hold a corresponding terminal of the IC package P.

The operation member 30A is a frame-shaped member, is urged upward with respect to the socket body 20A by an urging unit such as a spring, and is arranged so as to be vertically movable with respect to the socket body 20A. When the operation member 30A is pushed downward, the accommodation member 40A moves downward and the upper end portion 54A of the contact pin 50A is opened. When the downward pushing force of the operation member 30A is released, the operation member 30A is moved upward by the urging force of the urging unit and the accommodation member 40A moves upward accordingly to close the upper end portion 54A of the contact pin 50A, thereby the terminal of the IC package P is pinched and held at this time so that the IC package P and the wiring board S are electrically connected via the contact pin 50A.

An IC-package opening portion 31A as an "electrical-component opening portion (opening portion)" having a window shape is formed at the operation member 30A on the upstream side of the flowing air K, flowing in the test device, beside the accommodation portion 41A in which the IC package P is accommodated. Thus, the flowing air K supplied from the ventilation unit 3 is guided to the IC package P accommodated in the accommodation portion 41A.

Further, an IC-package discharge opening portion 32A as an "opening portion" having a window shape similar to the IC-package opening portion 31A is formed at the operation member 30A on the downstream side of the flowing air K, flowing in the test device, beside the accommodation portion 41A in which the IC package P is accommodated. Thus, the flowing air K having passed through the IC package P in the accommodation portion 41A is guided to the next IC socket 10A arranged on the downstream side.

On the upstream side of a sidewall portion of the operation member 30A, an opening portion 33A is formed on each of the right and left upper sides. Further, an opening portion 34A is formed as well on each of the right and left sides. The cooling effect is further enhanced by taking in the flowing air therethrough. Further, on the downstream side of a sidewall portion of the operation member 30A, an opening portion 36A is formed at a position facing the opening portion 33A on each of the right and left sides. The cooling effect is further enhanced by discharging the flowing air therethrough. Further, on the downstream side of a sidewall portion of the operation member 30A, an opening portion 38A is formed at a position facing the opening portion 34A on each of the right and left sides. The cooling effect is further enhanced by discharging the flowing air therethrough.

Further, an R-shaped portion 37A having an R-shaped corner portion is formed at the opening portion 33A of the operation member 30A on the upstream side, so that the flowing air flows smoothly without colliding the wall. Therefore, the flowing air can be smoothly taken into the inside, and the cooling effect is further enhanced.

Further, a cut-out portion 35A obliquely cut out is formed at the upper end on both sides of the operation member 30A to cause the flowing air to flow rearward without colliding. As a result, the test device is configured such that the flowing air can easily reach the IC socket 10A farther on the rear side.

Next, the operation of the present embodiment will be described with reference to FIGS. 15 to 19.

Here, description will be provided on a case in which the IC package P is accommodated in the IC socket 10 and a test is performed.

The IC socket 10A is attached to the wiring board S in advance. Then, the IC package P is electrically connected to the IC socket 10A by being set thereto by, for example, an automatic machine as follows.

That is, the IC package P is conveyed by the automatic machine and is held at a position above the accommodation portion 41A of the accommodation member 40A of the IC socket 10A. Then, the IC package P is accommodated in the accommodation portion 41A. At this time, the IC package P is accommodated in the accommodation portion 41A while being guided by the guide portion 42A. At the same time, the operation member 30A is pressed from the above by the automatic machine, and the operation member 30A is pushed downward against the urging force of the urging unit. Accordingly, the upper end portions 54A of the contact pins 50A are opened due to downward moving of the accommodation member 40A and ready to receive the IC package P. Thereafter, the pressing force onto the operation member 30A is released to move the operation member 30A upward. Accordingly, as the accommodation member 40A moves upward, the upper end portions of the contact pins 50A pinch and hold the terminals of the IC package P, and electrical connection is established among the IC package P, the contact pins 50A, and the wiring board S.

Thereafter, a burn-in test is performed in the test device. During the test, the flowing air K is smoothly discharged as being guided toward the inside of the IC socket 10A via the respective opening portions 21A, 22A, 23A, 31A, 32A, 33A, 34A, 36A, 38A, 45A, 46A, and cools the IC package P accommodated in the IC socket 10A to suppress the temperature rise. Specifically, the contact-pin opening portion 21A formed of a through hole is formed at the socket body 20A on the upstream side of the flowing air K (i.e., on the side of ventilation unit 3), flowing in the test device, beside the position where the contact pins 50A are arranged. Further, the IC-package opening portion 31 having a cut-out shape is formed at the operation member 30A on the upstream side of the flowing air K (i.e., on the side of the ventilation unit 3), flowing in the test device, beside the accommodation portion 41A in which the IC package P is accommodated. Thus, the flowing air K supplied from the ventilation unit 3 is guided to the contact pins 50A via the contact-pin opening portion 21A to cool the contact pins 50A in contact with the IC package P, thereby indirectly cooling the IC package P, and the flowing air K supplied from the ventilation unit 3 is guided to the IC package P accommodated in the accommodation portion 41A via the IC-package opening portion 31A to directly cool the IC package P. In this way, by effectively taking the flowing air K supplied from the ventilation unit 3 into the IC socket 10A and supplying the flowing air K to the contact pins 50A and the exposed portion of the IC package P, the IC package P can be efficiently cooled. Further, the cooling effect is further enhanced by taking in the air from the other opening portions, and the cooling effect is further enhanced by smoothly discharging the taken-in air from the opening portions.

In the test device, a plurality of the IC sockets 10A are arranged from the upstream side toward the downstream side. Then, the contact-pin discharge opening portion 22A formed of a through hole similar to the contact-pin opening portion 21A is formed at the socket body 20A on the downstream side of the flowing air K beside the position where the contact pins 50A are arranged. Further, the IC-package discharge opening portion 32A having a window shape similar to the IC-package opening portion 31A is formed at the operation member 30A on the downstream side of the flowing air K, flowing in the test device, beside the accommodation portion 41A in which the IC package P is accommodated. Thus, the flowing air K having passed through the socket body 20A and the IC package P in the accommodation portion 41A is guided to the IC socket 10A arranged on the downstream side, and the flowing air K passes continuously from the upstream side toward the downstream side to cool the IC package P on each IC socket 10A.

In the present embodiment, the operation member is moved in the vertical direction, but the present invention is not limited thereto and is also applicable to a type of moving in the horizontal direction.

<Effects>

According to the present invention, it is possible, while suppressing the cost, to cool an electrical component accommodated in the electrical component socket.

That is, according to the electrical component socket of the present invention, the electrical component accommodated in the electrical component socket can be cooled by being provided with the opening portion through which the flowing air supplied from the ventilation unit is supplied to the inside thereof. Further, it is possible to suppress the cost with a simple structure without using a member such as a heat sink.

Further, the contact-pin opening portion having a part thereof facing the plurality of contact pins in the IC socket be opened is arranged, and the flowing air is blown to the plurality of contact pins via the contact-pin opening portion. Therefore, the electrical component can be indirectly cooled by cooling the contact pins in contact with the electrical component.

Further, a plurality of opening portions each having a part thereof facing the electrical component accommodated in the electrical component socket be opened are arranged, and the flowing air is blown to the electrical component via the opening portions. Therefore, the electrical component can be reliably cooled by being blown directly with the flowing air.

Further, since the openings are formed at substantially the same positions of the two mutually-facing sidewall portions of the socket body, the flowing air having flowed into the electrical component socket passes therethrough more easily as being easily discharged. Therefore, the electrical component can be cooled more reliably.

Further, since the corner portions of the socket main body are each formed in an R shape along the flow of the flowing air, the flowing air can more smoothly flow into the electrical component socket, and the electrical component can be cooled more reliably.

Further, in the test device of the present invention, a plurality of the electrical component sockets are arranged from the upstream side toward the downstream side of the flowing air supplied from the ventilation unit. Thus, one ventilation unit causes the flowing air to pass through in succession from the upstream side to the downstream side, so that the plurality of electrical components accommodated in the plurality of electrical component sockets can be cooled simultaneously and efficiently.

The embodiments described above have been described for the purpose of facilitating understanding of the present invention, and are not intended to limit the present invention.

For example, in the above-described embodiment, the air blow guide member of the present invention is applied to a test device including an IC socket for accommodating an IC package, but the present invention is not limited thereto, and is also applicable to a socket for accommodating another electrical component and a test device therefor.

Further, in the above-described embodiments, description has been provided on the test device including the electrical component socket having a configuration in which an electrical component is placed on the accommodation portion of the electrical component socket from the above and terminals of the electrical component are protruded to a back side of the accommodation portion and held by upper end portions of the contact pins. However, not limited thereto, the present invention may be applied to a test device including an electrical component socket or the like to push and hold an electrical component with another method such as a pushing force of a latch.

Further, in the above-described embodiments, description has been provided using the IC package having a plurality of solder balls as terminals. However, not limited thereto, the present invention may be applied to an IC package having terminals other than solder balls and another electrical component.

Further, the present invention may be applied to cool contact pins each having a shape different from that described in the above-described embodiments.

Further, the configuration of the air blow guide member is not limited to the plate-like member provided with a through hole as in the above-described embodiments and modifications, and may be a member having another shape. Further, the air blow guide member is not limited to a single member, and may be configured by a plurality of members.

Further, the arrangement position of the air blow guide member is not limited to the position on the wiring board as in the above-described embodiment. Depending on the shapes of the test device and the electrical component socket, the position of the ventilation unit, and the like, the air blow guide member may be fixed to the socket body, may be arranged at a position above or obliquely above the electrical component socket in the test device, and the like.

Further, in the test device, the air blow guide members used from the upstream side to the downstream side are the same in the above-described embodiment. However, not limited thereto, shapes of the air blow guide members may be changed from the upstream side toward the downstream side. For example, since the air velocity tends to be high on the upstream side and low on the downstream side, the air blow guide members may be shaped to cause the air flow velocity of the flowing air through each air blow guide member to be kept higher on the downstream side than on the upstream side, and as a result, the test device as a whole may uniformly cool the electrical component without changing the air flow velocity of the flowing air colliding the electrical component.

REFERENCE SIGNS LIST

1 Test device
2 Test device unit
3 Ventilation unit
10, 10A IC socket (Electrical component socket)
20, 20A Socket body
21, 21A Contact-pin opening portion (Opening portion)
22, 22A Contact-pin discharge opening portion (Opening portion)
23A Opening portion
30, 30A Operation member
31, 31A IC-package opening portion (Electrical-component opening portion, Opening portion)
32, 32A IC-package discharge opening portion (Opening portion)
33A Opening portion
34A Opening portion
35A Cut-out portion
36A Opening portion
37A R-shaped portion
38A Opening portion
40, 40A Accommodation member
41, 41A Accommodation portion
42, 42A Guide portion
43A Narrow portion
44A R-shaped portion
45A Opening portion
46A Opening portion
50, 50A Contact pins
51A, 52A Elongated member
53A Fulcrum
54A Upper end portion
100, 200, 300, 400, 500 Air blow guide member
110, 210, 310, 410, 510 Air blow guide member body
111, 211, 311, 411, 511 Through hole
112, 212, 312, 412, 512 Inlet
113, 213, 313, 413, 513 Outlet
514 Intermediate position
G Gap
K Flowing air
P IC package (Electrical component)
S Wiring board

What is claimed is:

1. An electrical component socket, comprising:
a socket body arrangeable on a wiring board and including an accommodation portion in which an electrical component is accommodatable;
a contact pin in the socket body; and
an operation member configured to, with the socket body arranged on the wiring board and the electrical component accommodated in the accommodation portion, move vertically with respect to the socket body to electrically connect the electrical component and the wiring board via the contact pin, wherein
the socket body has a contact-pin opening portion formed at a first sidewall portion of the socket body, the operation member has an electrical-component opening portion formed in the operation member, and
the contact-pin opening portion and the electrical-component opening portion are configured so that, when the electrical component and the wiring board are electrically connected via the contact pin due to the operation member being moved vertically with respect to the socket body, and a flow of air is directed to a side of the electrical component socket, the contact-pin opening portion and the electrical-component opening portion are positioned to face the flow of air so that air is suppliable through the contact-pin opening portion to the contact pin and through the electrical-component opening portion to the electrical component.

2. A test device unit, comprising:
the electrical component socket according to claim 1; and
an air blow guide member having a plate-shaped air blow guide member body and a through hole formed in the plate-shaped air blow guide member body to guide the flow of air toward the electrical component socket.

3. A test device, comprising:
a plurality of test device units, each test device unit of the plurality of test device units including an electrical component socket according to claim 1, and the plurality of test device units arranged in line from an upstream side toward a downstream side of the flow of air, and
a plurality of blow guide members corresponding, respectively, to the plurality of test device units, wherein
the plurality of blow guide members are arranged so that each blow guide member is adjacent to, and upstream, of the corresponding test device unit, and
each blow guide member of the plurality of blow guide members has a plate-shaped air blow guide member body and a through hole formed in the plate-shaped air blow guide member body to guide the flow of air toward the electrical component socket included in the corresponding test device unit.

4. The electrical component socket according to claim 1, wherein
the socket body has a contact-pin discharge opening portion formed at a second sidewall portion, opposite to the first sidewall portion, of the socket body so that the air supplied to the contact pin is discharged through the contact-pin discharge opening portion,
the electrical-component opening portion is formed on a first side of the operation member, and
the operation member has an electrical-component discharge opening portion on a second side, opposite the first side, of the operation member, so that the air supplied to the electrical component is discharged through the electrical-component discharge opening portion.

5. The electrical component socket according to claim 1, wherein the socket body has a corner portion which is R-shaped.

6. A test device, comprising:
a plurality of test device units, each test device unit of the plurality of test device units including an electrical component socket according to claim 4, the plurality of test device units arranged in line from an upstream side toward a downstream side of the flow of air;
a plurality of blow guide members corresponding, respectively, to the plurality of test device units, wherein the plurality of blow guide members are arranged so that each blow guide member is adjacent to, and upstream, of the corresponding test device unit, and each blow guide member of the plurality of blow guide members has a plate-shaped air blow guide member body and a through hole formed in the plate-shaped air blow guide member body to guide the flow of air toward the electrical component socket included in the corresponding test device unit.

7. A test device unit, comprising:
the electrical component socket according to claim 4; and
an air blow guide member having a plate-shaped air blow guide member body and a through hole formed in the plate-shaped air blow guide member body to guide the flow of air toward the electrical component socket.

\* \* \* \* \*